United States Patent
Ho et al.

(10) Patent No.: US 12,148,675 B2
(45) Date of Patent: Nov. 19, 2024

(54) POWER SEMICONDUCTOR PACKAGE UNIT OF SURFACE MOUNT TECHNOLOGY INCLUDING A PLASTIC FILM COVERING A CHIP

(71) Applicant: Panjit International Inc., Kaohsiung (TW)

(72) Inventors: Chung-Hsiung Ho, Kaohsiung (TW); Wei-Ming Hung, Kaohsiung (TW); Wen-Liang Huang, Kaohsiung (TW); Shun-Chi Shen, Kaohsiung (TW); Chien-Chun Wang, Tainan (TW); Chi-Hsueh Li, Tainan (TW)

(73) Assignee: Panjit International Inc., Kaohsiung (TW)

( * ) Notice: Subject to any disclaimer, the term of this patent is extended or adjusted under 35 U.S.C. 154(b) by 434 days.

(21) Appl. No.: 17/543,872

(22) Filed: Dec. 7, 2021

(65) Prior Publication Data

US 2022/0344228 A1    Oct. 27, 2022

Related U.S. Application Data

(60) Provisional application No. 63/178,675, filed on Apr. 23, 2021.

(51) Int. Cl.
*H01L 23/31* (2006.01)
*H01L 21/48* (2006.01)
(Continued)

(52) U.S. Cl.
CPC ...... *H01L 23/3107* (2013.01); *H01L 21/4814* (2013.01); *H01L 21/568* (2013.01);
(Continued)

(58) Field of Classification Search
CPC . H01L 23/3107; H01L 23/481; H01L 23/552; H01L 21/56; H01L 24/08;
(Continued)

(56) References Cited

U.S. PATENT DOCUMENTS 5,111,278 A * 5/1992 Eichelberger ....... H01L 23/5389
257/725
6,306,680 B1 * 10/2001 Fillion .................... H01L 24/96
257/E23.125
(Continued)

*Primary Examiner* — Khiem D Nguyen
(74) *Attorney, Agent, or Firm* — Best & Flanagan LLP

(57) ABSTRACT

The present invention includes a chip, a plastic film layer, and an electroplated layer. A front side and a back side of the chip each comprises a signal contact. The plastic film layer covers the chip and includes a first via and a second via. The first via is formed adjacent to the chip, and the second via is formed extending to the signal contact of the front side. A conductive layer is added in the first and the second via. The conductive layer in the second via is electrically connected to the signal contact of the front side. Through the electroplated layer, the signal contact on the back side is electrically connected to the conductive layer in the first via. The conductive layer protrudes from the plastic film layer as conductive terminals. The present invention achieves electrical connection of the chip without using expensive die bonding materials.

14 Claims, 15 Drawing Sheets

(51) Int. Cl.
*H01L 21/56* (2006.01)
*H01L 23/00* (2006.01)
*H01L 23/48* (2006.01)

(52) U.S. Cl.
CPC ............ *H01L 23/481* (2013.01); *H01L 24/08* (2013.01); *H01L 24/29* (2013.01); *H01L 2224/08235* (2013.01); *H01L 2224/29147* (2013.01)

(58) Field of Classification Search
CPC ......... H01L 24/19; H01L 24/20; H01L 24/29; H01L 24/96; H01L 2224/08235; H01L 2224/29147
See application file for complete search history.

(56) References Cited

U.S. PATENT DOCUMENTS

| | | | |
|---|---|---|---|
| 8,237,259 B2 | 8/2012 | Pressel et al. | |
| 8,603,858 B2 | 12/2013 | Standing et al. | |
| 8,669,655 B2 | 3/2014 | Geitner et al. | |
| 9,040,346 B2 | 5/2015 | Nikitin et al. | |
| 10,818,635 B2 | 10/2020 | Olson et al. | |
| 2003/0168255 A1* | 9/2003 | Kim | H05K 3/4623 174/261 |
| 2010/0123225 A1 | 5/2010 | Gruenhagen et al. | |
| 2013/0292684 A1* | 11/2013 | Nikitin | H01L 23/34 257/E29.089 |
| 2014/0035154 A1* | 2/2014 | Geitner | H01L 24/96 257/E23.116 |
| 2015/0155267 A1 | 6/2015 | Hoegerl et al. | |
| 2018/0197837 A1* | 7/2018 | Yu | H01L 21/31053 |
| 2019/0295972 A1* | 9/2019 | Tsai | H01L 23/481 |

* cited by examiner

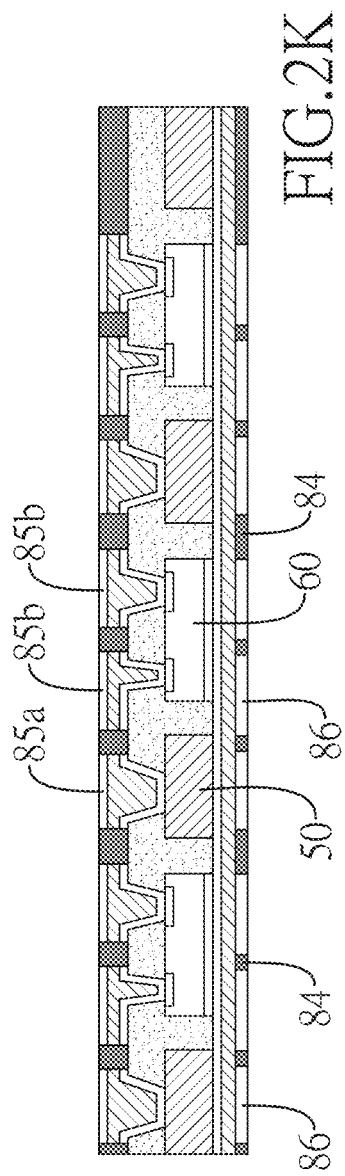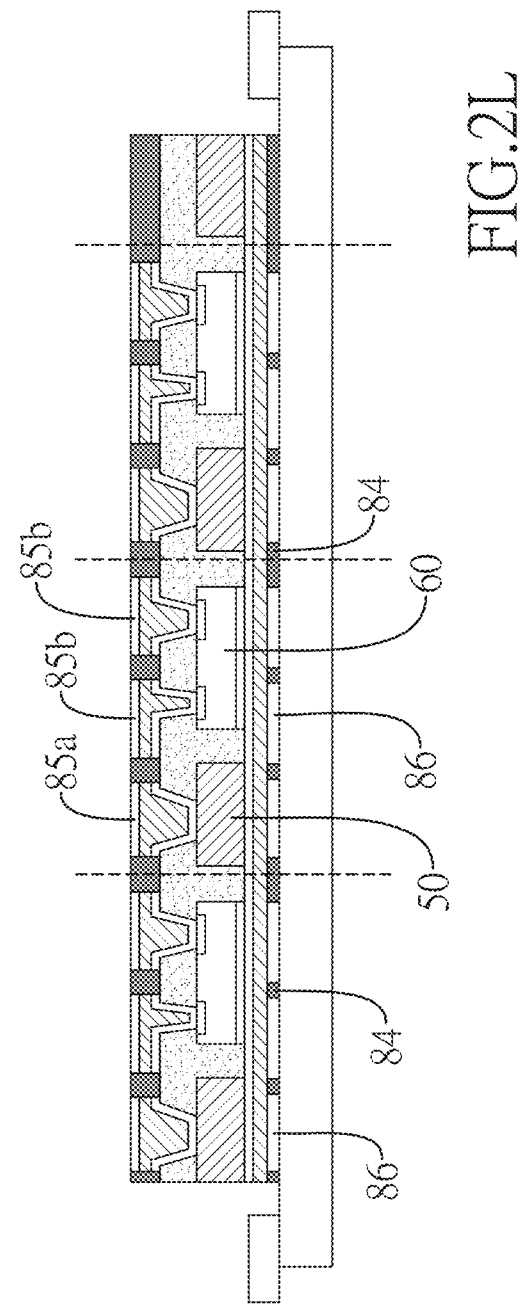

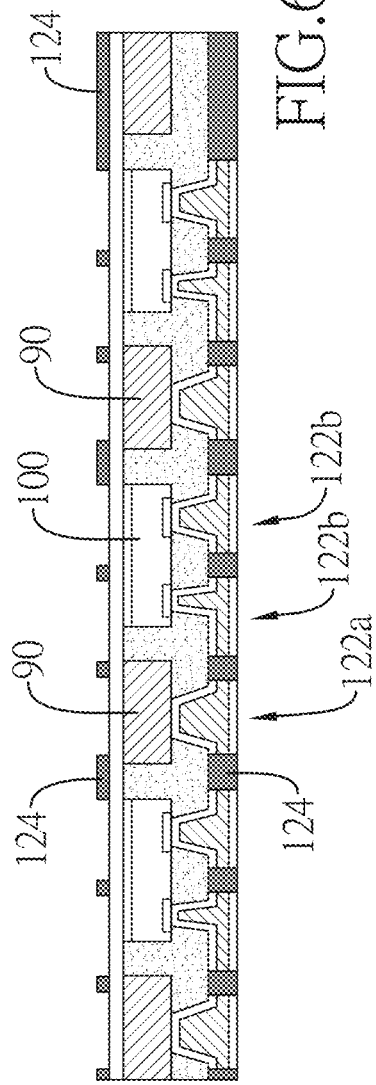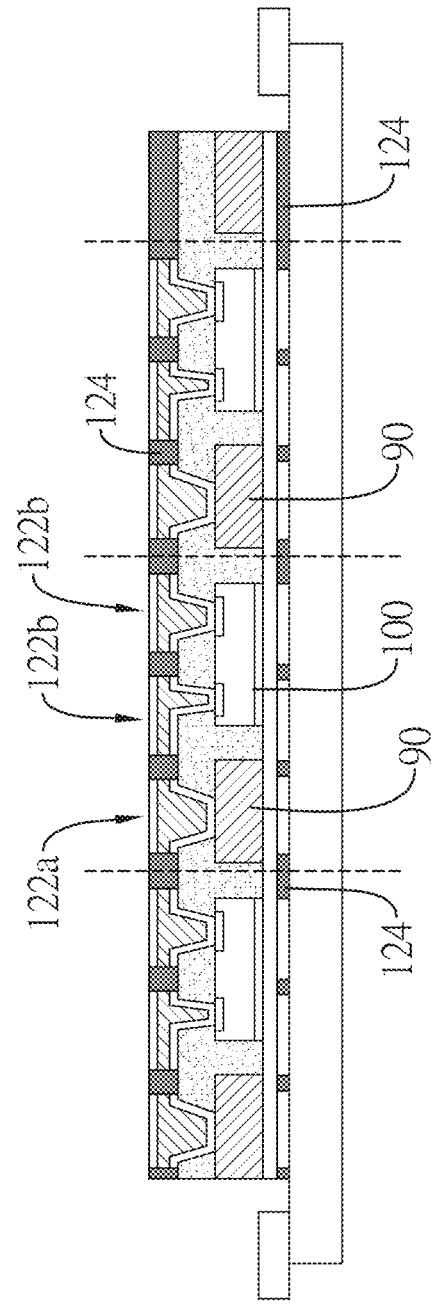

POWER SEMICONDUCTOR PACKAGE UNIT OF SURFACE MOUNT TECHNOLOGY INCLUDING A PLASTIC FILM COVERING A CHIP

CROSS-REFERENCE TO RELATED APPLICATION(S)

This application claims the priority benefit of U.S. application Ser. No. 63/178,675 filed on Apr. 23, 2021, the entirety of which is hereby incorporated by reference herein and made a part of the specification.

BACKGROUND OF THE INVENTION

1. Field of the Invention

The present invention relates to a package unit, more particularly a power semiconductor package unit of surface mount technology (SMT) and manufacturing method thereof.

2. Description of the Related Art

A discrete package is an electronic package with independent functionalities. Depending on a chip function of the electronic package, the electronic package can be categorized into different types of packages, such as a diode package, a power transistor package, etc. The electronic package mainly includes a chip, a lead frame, wires, an insulating plastic shell, etc. With reference to U.S. Pat. No. 8,237,259, a traditional manufacturing method of discrete package is disclosed. According to the patent, materials such as silver paste, silver (Ag) sintering, and solder paste or soft solder are provided to a side of a chip as main adhesives for die bonding. With reference to component number 316 in FIG. 6 of the patent, the main adhesives are used to die bonding the chip to the lead frame. However, using silver paste or silver (Ag) sintering is materially expensive, hence hindering abilities to lower manufacturing costs. Using solder paste or soft solder on the other hand causes environmental problems, and thus is also ill recommended for use.

SUMMARY OF THE INVENTION

The present invention provides a power semiconductor package unit of surface mount technology (SMT) and manufacturing method thereof in order to lower manufacturing costs.

To achieve the aforementioned goal, the present invention provides a power semiconductor package unit of SMT, including:
  a chip, including a front side and a back side; wherein the front side and the back side are opposite to each other, and the front side and the back side each includes a signal contact; wherein the chip is a power semiconductor chip;
  a plastic film layer, covering the chip, including a first via and a second via; wherein the first via is formed adjacent to the chip, and the second via is formed extending to the signal contact of the front side of the chip; wherein in both the first via and the second via, a conductive layer is formed; wherein the conductive layer in the second via is electrically connected to the signal contact of the front side of the chip;
  a conducting layer, formed on the back side of the chip, electrically connecting the conductive layer in the first via and the signal contact of the back side of the chip; wherein the conducting layer is an electroplated layer;
  wherein the conductive layer in the first via and the conductive layer in the second via both protrude from a surface of the plastic film layer and serve as conductive terminals of the power semiconductor package unit of surface mount technology (SMT);
  wherein the conductive layer in the first via and the conductive layer in the second via are both formed through electroplating, and both electrically connect the signal contact of the front side of the chip and the signal contact of the back side of the chip to the same surface, without a need for a lead frame and adhesives.

In another embodiment, the present invention provides a power semiconductor package unit of surface mount technology (SMT), including:
  a chip, including a front side and a back side; wherein the front side and the back side are opposite to each other, and the front side and the back side each includes a signal contact;
  a conductive board, including a chip placed opening; wherein the chip is mounted inside the chip placed opening;
  a plastic film layer, covering the chip and the conductive board, including a first via and a second via; wherein the first via is formed adjacent to the chip, and the first via extends to a surface of the conductive board; the second via is formed extending to the signal contact of the front side of the chip; wherein in both the first via and the second via, a conductive layer is formed; wherein the conductive layer in the first via is electrically connected to the conductive board, and the conductive layer in the second via is electrically connected to the signal contact of the front side of the chip;
  a conducting layer, formed on the back side of the chip, electrically connecting the conductive board and the signal contact of the back side of the chip;
  wherein, the conductive layer in the first via and the conductive layer in the second via both protrude from a surface of the plastic film layer and serve as conductive terminals of the power semiconductor package unit of SMT.

BRIEF DESCRIPTION OF THE DRAWINGS

FIGS. 2A to 2L are manufacturing perspective views of a second embodiment of the present invention.

FIGS. 6A to 6J are perspective views of a third embodiment of the present invention.

DETAILED DESCRIPTION OF THE INVENTION

The present invention provides a power semiconductor package unit of surface mount technology (SMT) and manufacturing method thereof. FIGS. 1A to 1M detail a manufacturing process of a first embodiment of the present invention. The following paragraphs will describe the manufacturing process in numerical order of the figures.

Figure 1A:
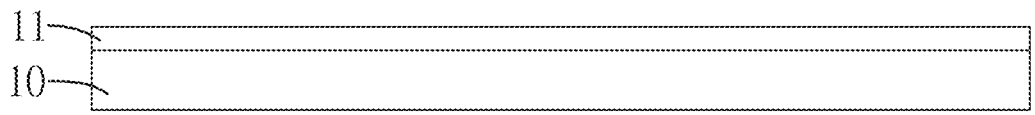
FIGS. 1A to 1M are manufacturing perspective views of a first embodiment of the present invention.

With reference to FIG. 1A, a carrier 10 is first prepared. An adhesive tape 11 is added on the carrier 10. A surface of the adhesive tape 11 is adhesive, as suggested by the name.

Figure 1B:
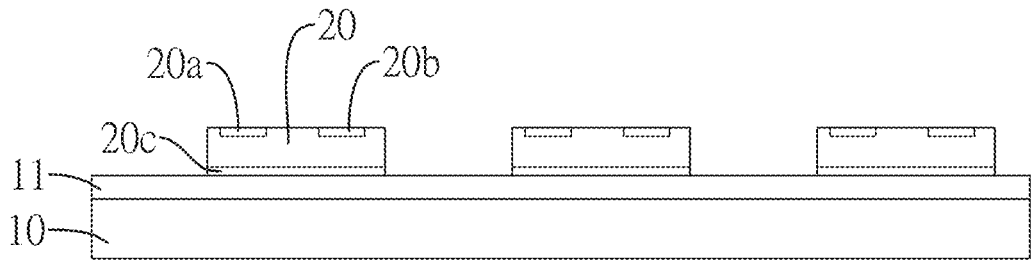

With reference to FIG. 1B, multiple chips 20 are mounted on the adhesive tape 11 and spaced from each other. Each of the chips 20 is a power semiconductor chip, and each of the chips 20 includes a front side and a back side. The front side and the back side are opposite to each other, and the front side and the back side each includes a signal contact, wherein each of the signal contact is an aluminum pad. More particularly, each of the chips 20 includes a first signal contact 20a and a second signal contact 20b on the front side, and a third signal contact 20c on the back side. In FIG. 1B, the back side of each of the chips is a side for sticking to the adhesive tape 11, and an opposite side of each of the chips facing away from the adhesive tape 11 is the front side. In other words, the third signal contact 20c for each of the chips 20 is mounted on the adhesive tape 11.

Figure 1C:
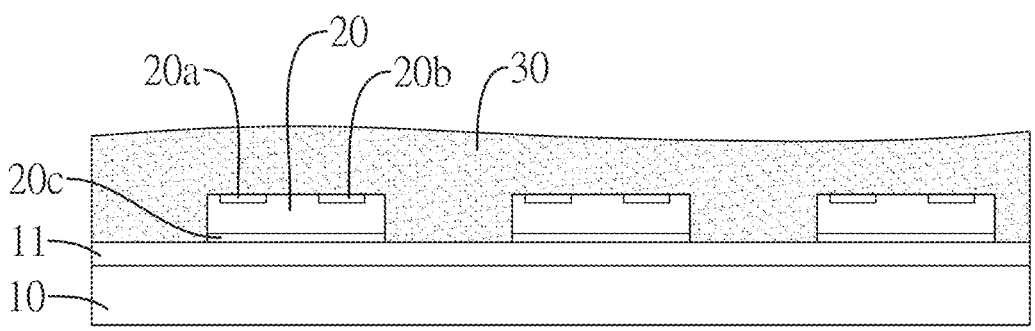
Figure 1D:
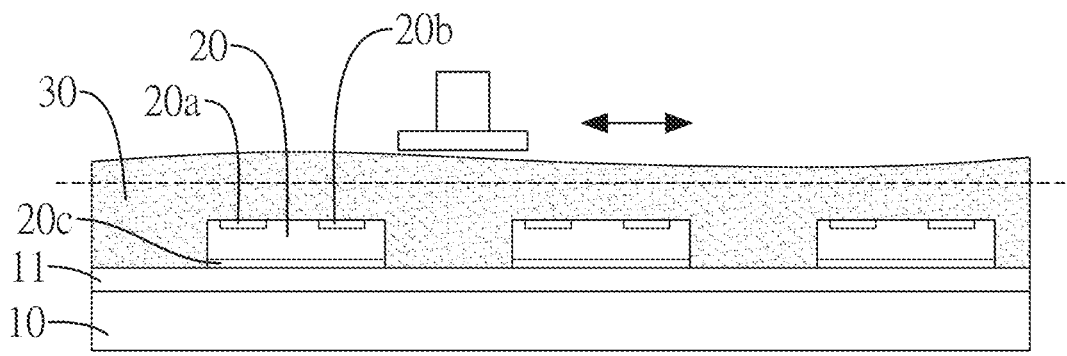

With reference to FIGS. 1C and 1D, the chips 20 are covered with a plastic film layer 30. The plastic film layer 30 is made of dielectric materials such as PP or EMC. Once the plastic film layer 30 is formed, further flatten the plastic film layer 30 as shown in FIG. 1D. To flatten the plastic film layer 30, the surface is subject to grinding or cleaning processes to make the surface flat and even.

Figure 1E:
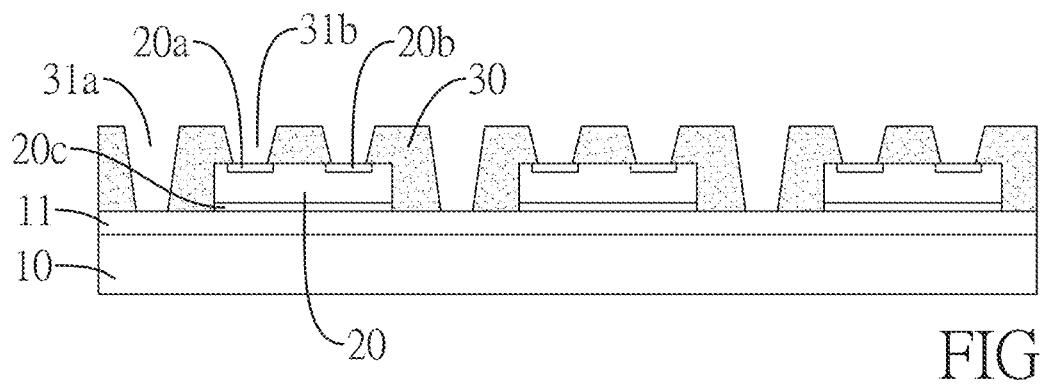

With reference to FIG. 1E, under a pre-designated area of the plastic film layer 30, multiple first vias 31a and multiple second vias 31b are formed. The pre-designated area where the first vias 31a and the second vias 31b are formed is determined by where conductive terminals of a final product should be located. The first vias 31a are adjacent to the chips 20, and the first vias 31a are formed through the plastic film layer 30. The second vias 31b extend from the surface of the plastic film layer 30 to the first signal contact 20a and the second signal contact 20b on the front side of each of the chips 20. The first vias 31a and the second vias 31b are formed with methods such as laser drilling, ultrasonic drilling, micro electrical discharge machining (μ-EDM), micro powder blasting, or inductively coupled plasma reactive ion etching (ICP-RIE). The first vias 31a and the second vias 31b are free to be formed with other methods in other embodiments of the present invention. The first vias 31a and the second vias 31b detailed here serve to explain different locations of vias, in order to differentiate different types of vias by relative locations, rather than to numerically specify how many of the first vias and the second vias are present.

Figure 1F:
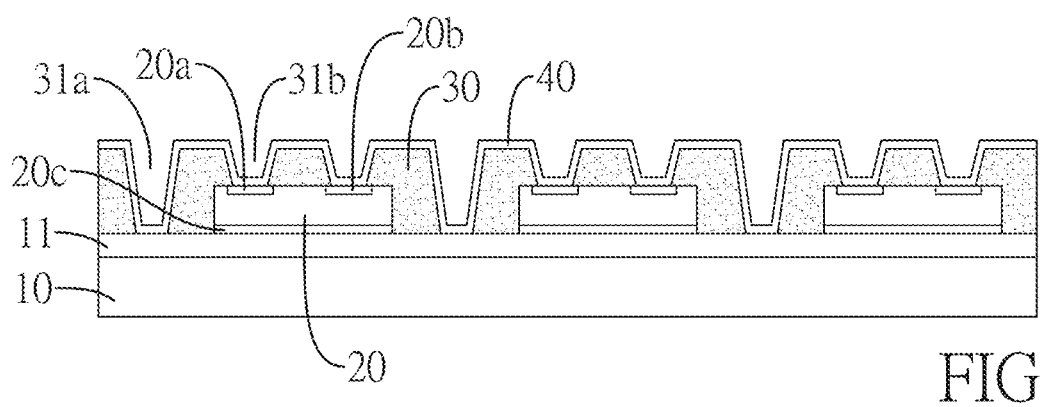

With reference to FIG. 1F, a pre-electroplated layer 40 is formed across inner surfaces of the first vias 31a and of the second vias 31b, and the surface of the plastic film layer 30. The pre-electroplated layer 40 serves as a seed layer for an electroplating process of later manufacturing stages. The pre-electroplated layer 40 is formed through methods such as electro-less plating or sputtering.

Figure 1G:
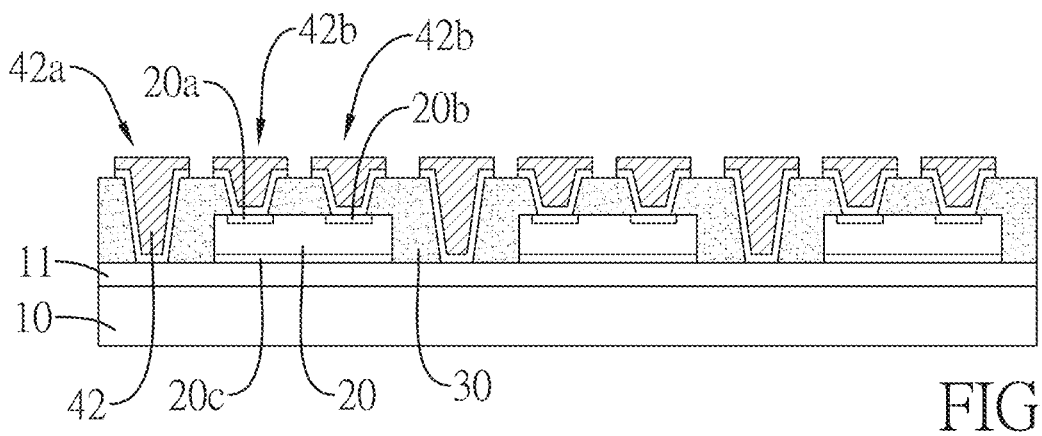

With reference to FIG. 1G, within each of the first vias 31a, the second vias 31b, and the surface of the plastic film layer 30, a conductive layer 42 is patterned and formed. The conductive layer 42 protrudes from the surface of the plastic film layer 30, and for the parts of the conductive layer 42 protruding out of the surface of the plastic film layer 30, multiple independent conductive terminals are formed. The conductive terminals are formed either through etching or other methods. As such, each location of the first vias 31a and the second vias 31b constitutes a pair of the conductive terminals 42a, 42b. Elsewise, according to designs of each of the chips 20, several of the first vias 31a and the second vias 31b can electrically connect to each other through the conductive layer 42, hence forming a common terminal. In the present embodiment, the conductive layer 42 is a copper layer, and the conductive layer 42 is made through electroplating or printing.

Figure 1H:
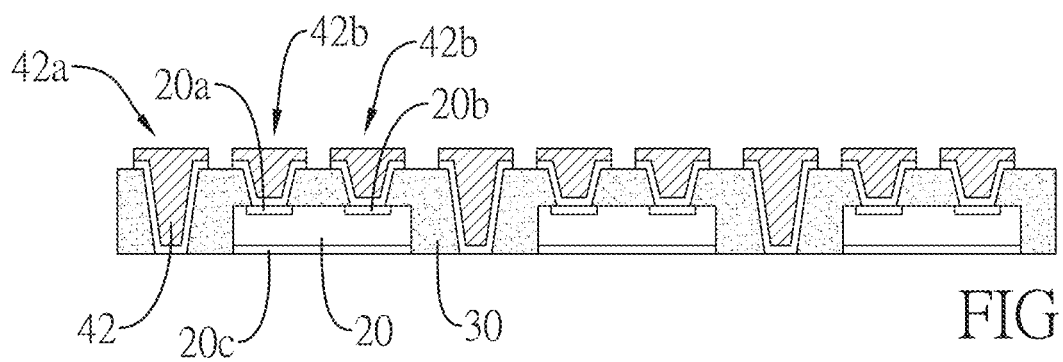
Figure 1I:
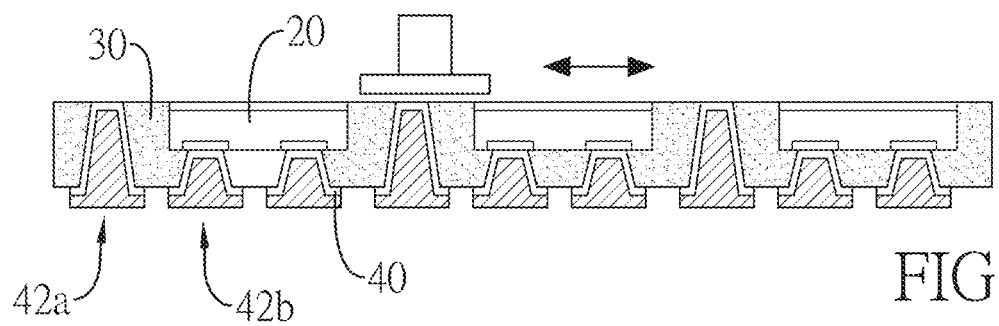

With reference to FIGS. 1H and 1I, upon forming the conductive layer 42, the carrier 10 and the adhesive tape 11 are removed to expose bottoms of the plastic film layer 30, of the first vias 31a, of the second vias 31b. If a bottom of the plastic film layer 30 is uneven or dirty, then as required grinding or cleaning of the bottom of the plastic film layer 30 creates a flat and even bottom surface.

Figure 1J:
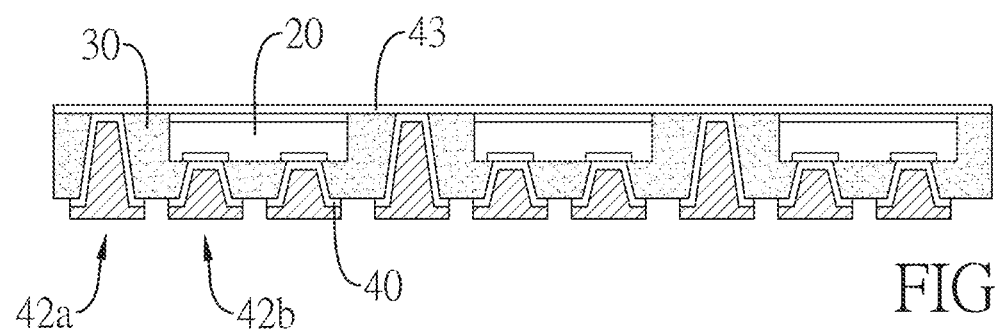

With reference to FIG. 1J, once the bottom of the plastic film layer 30 is exposed, an electroplated layer 43 is formed on the bottom of the plastic film layer 30 and the back side of the chips 20. The electroplated layer 43 is electrically connected to both the third signal contact 20c on the back side of each of the chips 20 and the conductive terminal 42a corresponding to the third signal contact 20c on the back side of each of the chips 20. The electroplated layer 43 is formed by methods such as electro-less plating and sputtering. With reference to FIG. 1J, in the current embodiment, only the third signal contact 20c is located on the back side of each of the chips 20. Through the electroplated layer 43, the third signal contact 20c is electrically connected to one of the conductive terminals 42a around each of the chips 20, forming a signal transferring pathway. In another embodiment, multiple signal contacts are located on the back side of each of the chips 20. The multiple signal contacts are connected to the multiple conductive terminals 42a around each of the chips 20.

Figure 1K:
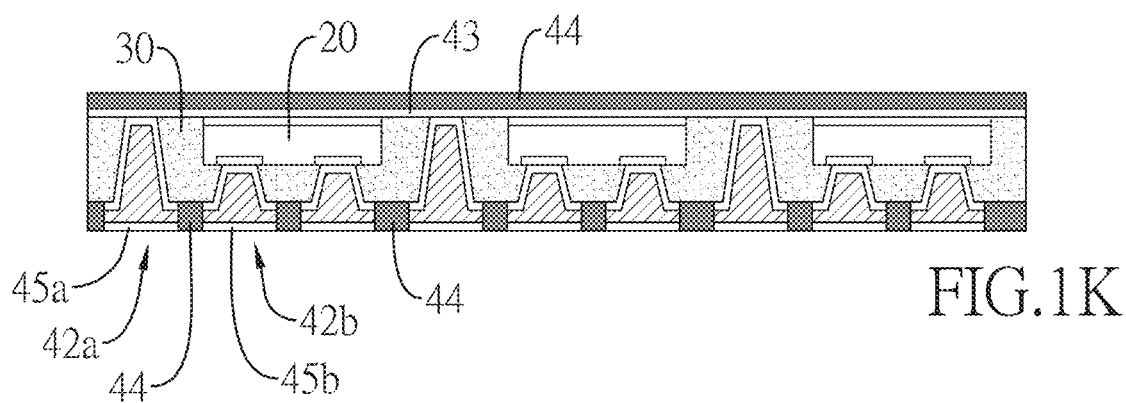

With reference to FIG. 1K, an insulating protective layer 44 of insulating material is formed on the bottom side and a top side of the plastic film layer 30. The insulating protective layer 44 has functions of moist proof and anti-oxidation. The insulating protective layer 44 on the top side of the plastic film layer 30 is formed between each of the adjacent conductive terminals 42a, 42b. The insulating protective layer 44 functions as a solder mask, decreasing possibilities of short circuit between each of the adjacent conductive terminals 42a, 42b amidst soldering. Once the insulating protective layer 44 is formed, on a surface of each of the conductive terminals 42a, 42b, a terminal protection layer 45a, 45b is formed. The terminal protection layer 45a, 45b is formed by an electro-less nickel immersion gold (ENIG) method.

Figure 1L:
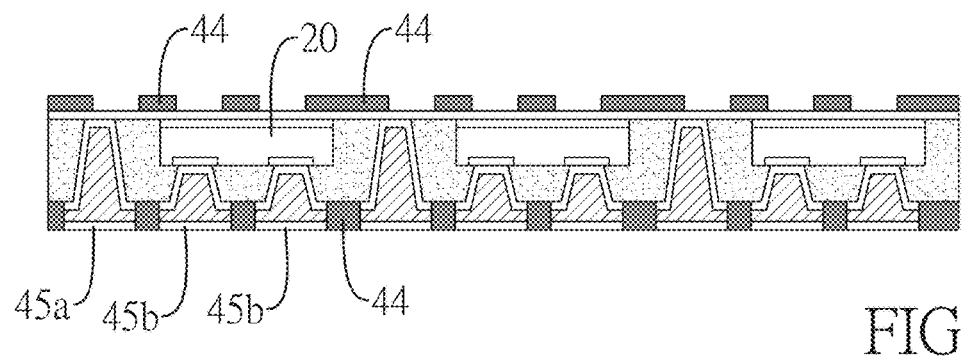
Figure 1M:
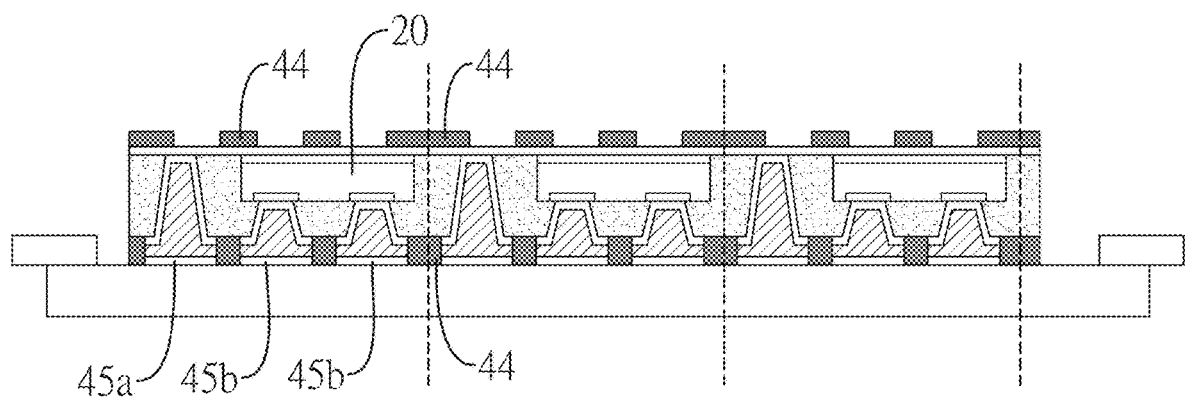

With reference to FIGS. 1L and 1M, the insulating protective layer 44 on the bottom side of the plastic film layer 30 is further processed by a marking process to leave a mark of product on the insulating protective layer 44. The marking process, for instance, can be a laser marking process or a lithographic process. With reference to FIG. 1M, in the end a sawing process is applied to pre-determined locations for separating each of the chips 20. As such, each of the chips 20 with the plastic film layer 30 becomes an independent package product.

With reference to FIGS. 2A to 2L and FIGS. 3 to 5, a manufacturing process is detailed for a second embodiment of the present invention.

Figure 2A:
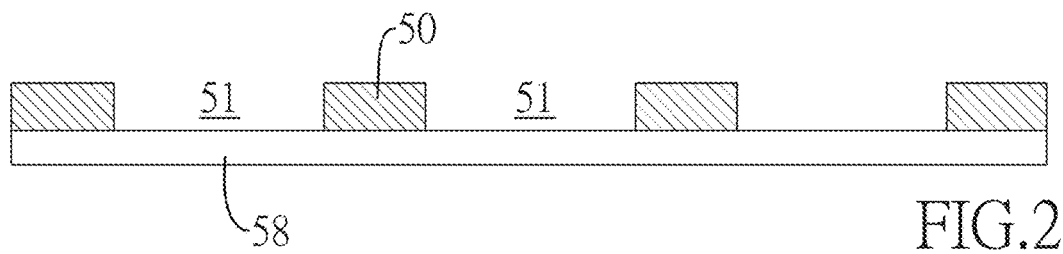
Figure 3:
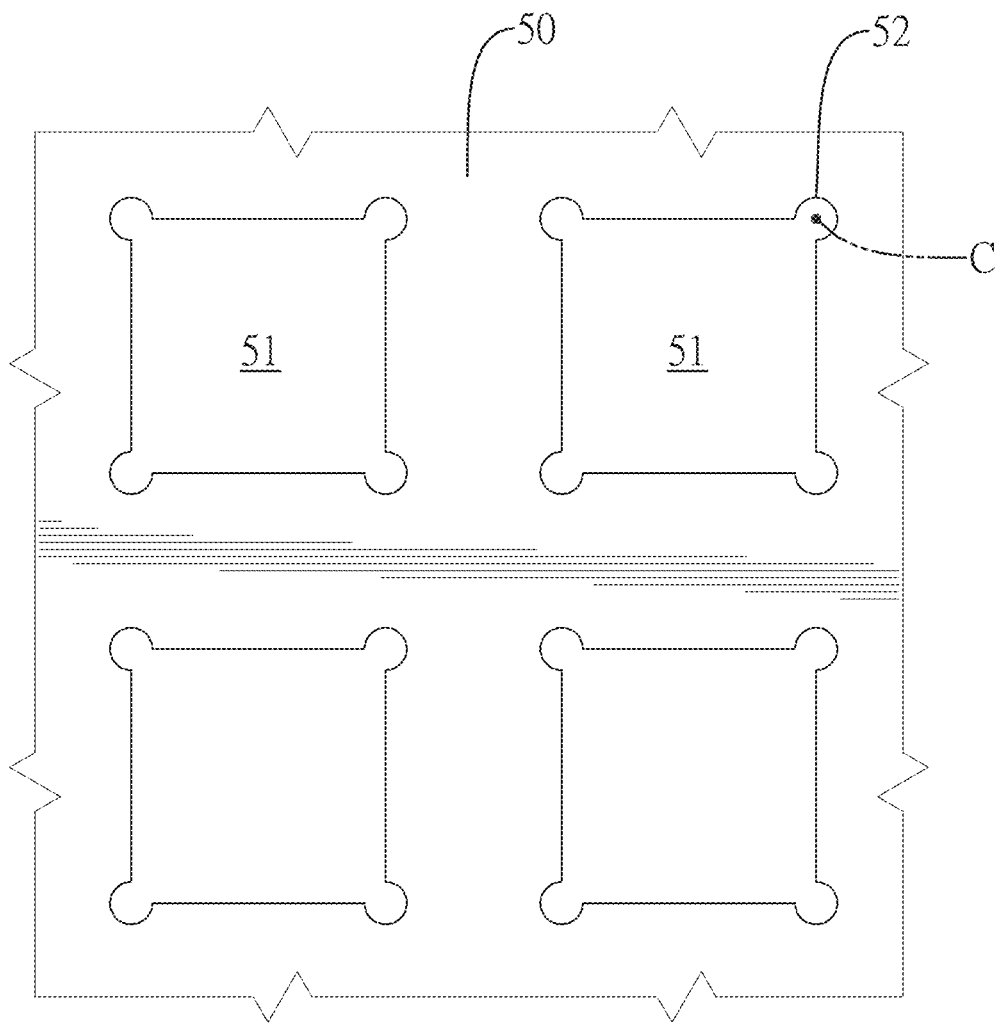
FIG. 3 is a surface perspective view of a copper board of the present invention.
Figure 4:
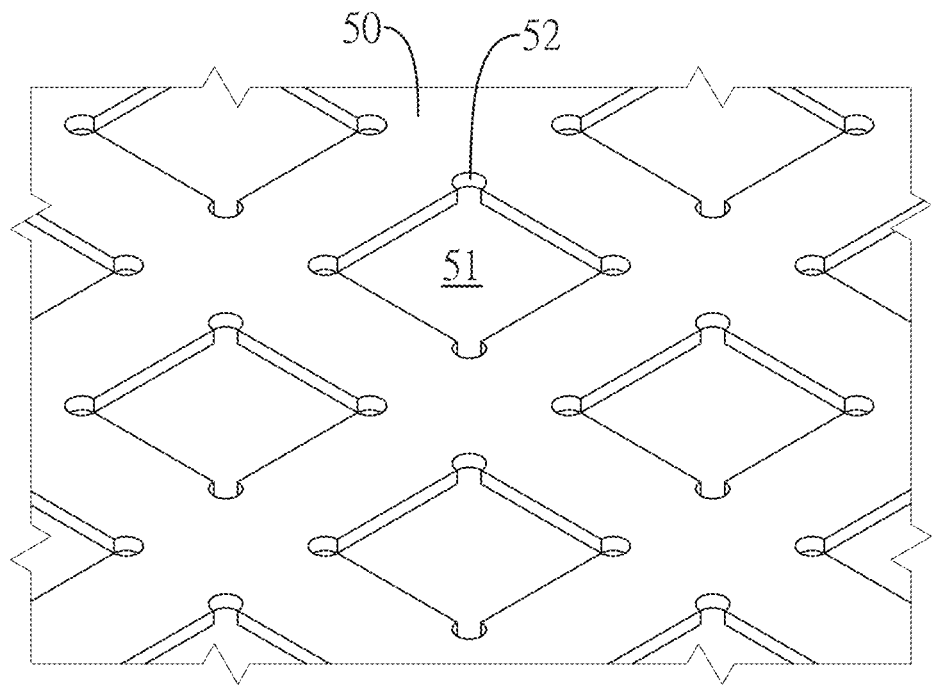
FIG. 4 is a three dimensional perspective view of the copper board of the present invention.

With reference to FIG. 2A, a copper board 50 is prepared. An adhesive tape 58 is mounted on a bottom side of the copper board 50. A surface of the adhesive tape 58 is adhesive, as suggested by the name. The copper board 50 has structure same as depicted in FIGS. 3 and 4, wherein multiple chip placed openings 51 are formed on the copper board 50. Each of the chip placed openings 51 is in a rectangular shape, and each corner of each of the chip placed openings 51 includes a corner anti-collision space 52. Each of the corner anti-collision spaces 52 extends outward away from each of the corners of the chip placed opening 51, and each of the corner anti-collision spaces 52 communicates with the chip placed opening 51. In the present embodiment, each of the corner anti-collision spaces 52 uses a tip of the corner of the chip placed opening 51 as a center C of a circle. The circles then extend outward away from each of the corners of the chip placed opening 51, creating circular bumper spaces. In other embodiments, the corner anti-collision spaces 52 are free to be in other shapes, such as rectangles, squares, or polygons. The corner anti-collision spaces 52 are made through machining (such as milling), or chemical processing (such as etching).

Figure 2B:
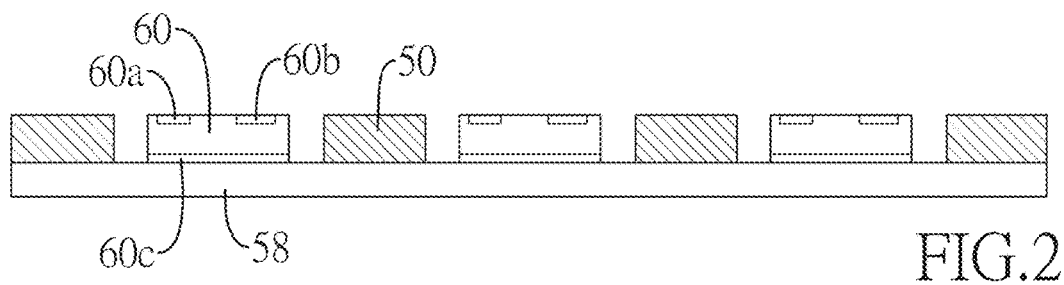
Figure 5:
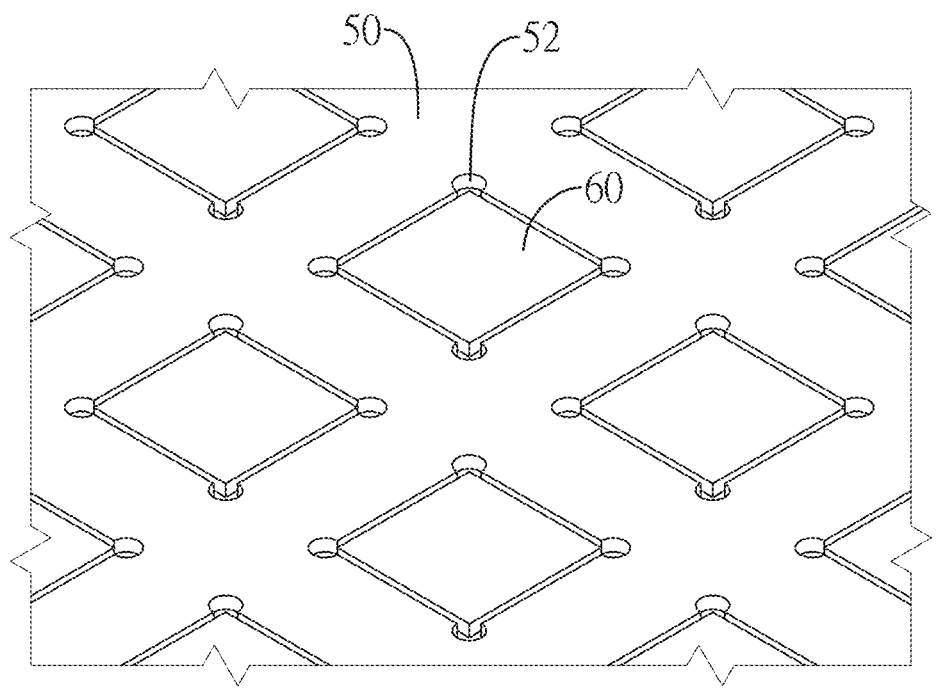
FIG. 5 is a three dimensional perspective view of mounting a chip on the copper board of the present invention.

With reference to FIG. 2B, among multiple chips 60, each of the chips 60 is mounted within each of the chip placed openings 51, and each of the chips 60 is a power semiconductor chip. A signal contact is formed on a front side and a back side of each of the chips 60, wherein each of the signal contact is an aluminum pad. More particularly, each of the chips 60 includes a first signal contact 60a and a second signal contact 60b on the front side, and a third signal contact 60c on the back side. With reference to FIG. 2B, the back side of each of the chips 60 refers to a side of each of the chips 60 facing the adhesive tape 58, and the front side of each of the chips 60 refers to a side of each of the chips 60 facing away from the adhesive tape 58. In other words, the third signal contact 60c for each of the chips 20 is mounted on the adhesive tape 58. In a die bonding process, as depicted in FIG. 5, since the corner anti-collision spaces 52 extend away from the corners of the chip placed openings 51, the corner anti-collision spaces 52 prevent corners of each of the chips 60 from directly bumping into the copper board 50. In other words, the corner anti-collision spaces 52 prevent the chips 60 from damage.

Figure 2C:
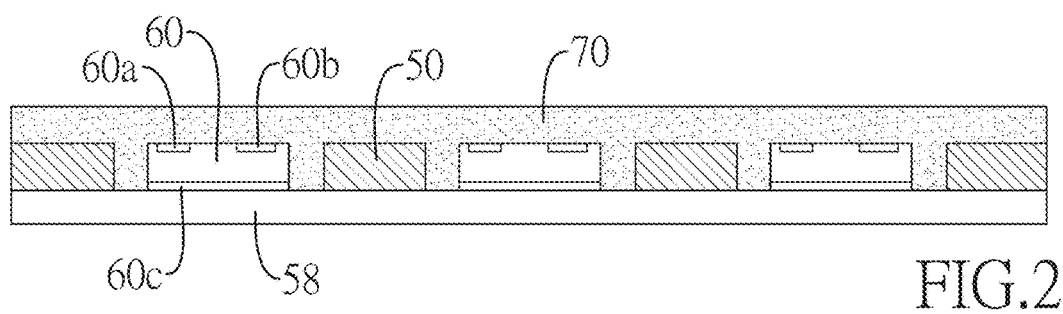

With reference to FIG. 2C, the chips 60 are covered with a plastic film layer 70. The plastic film layer 70 is made of dielectric materials such as PP or EMC. Once the plastic film layer 70 is formed, the plastic film layer 70 may be flattened. To flatten the plastic film layer 70, a surface of the plastic film layer 70 is subject to grinding or cleaning processes to make the surface flat and even.

Figure 2D:
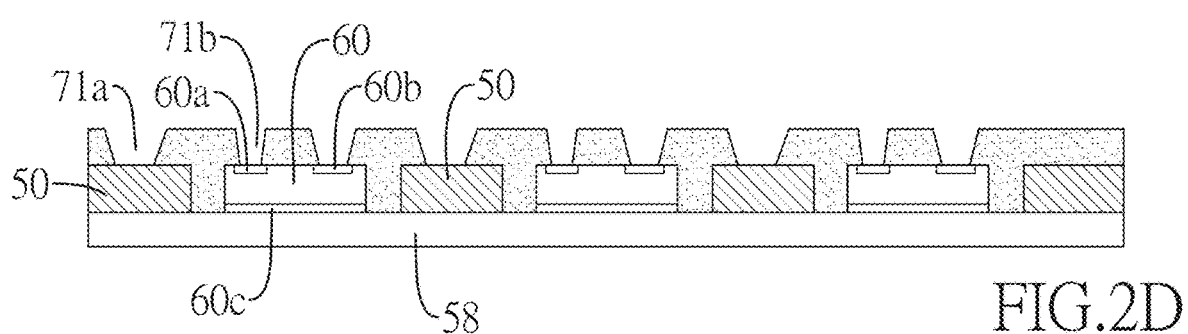

With reference to FIG. 2D, under a pre-designated area of the plastic film layer 70, multiple first vias 71a and multiple second vias 71b are formed. The pre-designated area where the first vias 71a and the second vias 71b are formed is determined by where conductive terminals of a final product should be located. The first vias 71a are adjacent to the chip 60, and the first vias 71a extend to the copper board 50. The second vias 71b extend from the surface of the plastic film layer 70 to the first signal contact 60a and the second signal contact 60b on the front side of each of the chips 60. The first/second vias 71a, 71b are formed with methods such as laser drilling, ultrasonic drilling, micro electrical discharge machining (μ-EDM), micro powder blasting, or inductively coupled plasma reactive ion etching (ICP-RIE). The first/second vias 71a, 71b are free to be formed with other methods in other embodiments of the present invention.

Figure 2E:
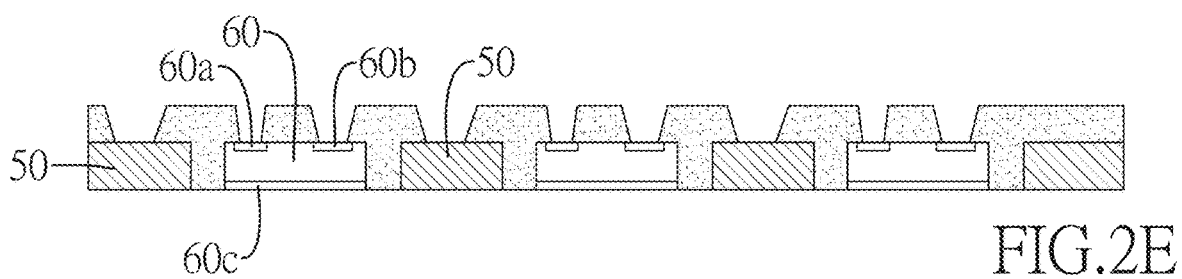
Figure 2F:
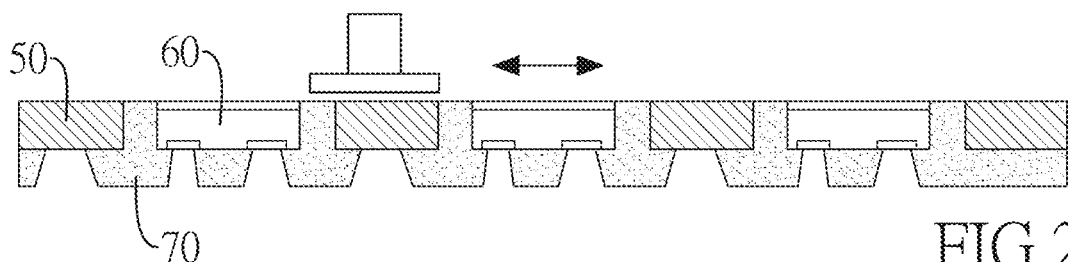

With reference to FIGS. 2E and 2F, once the first/second vias 71a, 71b are formed, the adhesive tape 58 is removed to expose bottoms of the plastic film layer 70, the chips 60, and the copper board 50. Based on material properties of the adhesive tape 58, heat or ultra-violet light may be applied to the adhesive tape 58 for removing the adhesive tape 58 away from the copper board 50. With reference to FIG. 2F, if the bottoms of the plastic film layer 70 and the copper barrier are uneven or dirty, then as required grinding or cleaning of the bottoms creates flat and even bottom surfaces.

Figure 2G:
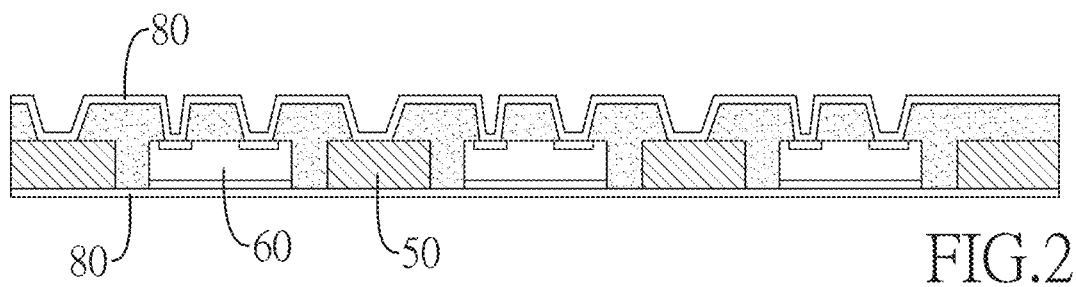

With reference to FIG. 2G, a pre-electroplated layer 80 is formed across inner surfaces of each of the first/second vias 71a, 71b, and bottoms of the plastic film layer 70, the chips 60, and the copper board 50. The pre-electroplated layer 80 serves as a seed layer for an electroplating process of later manufacturing stages. The pre-electroplated layer 80 is formed through methods such as electro-less plating or sputtering.

Figure 2H:
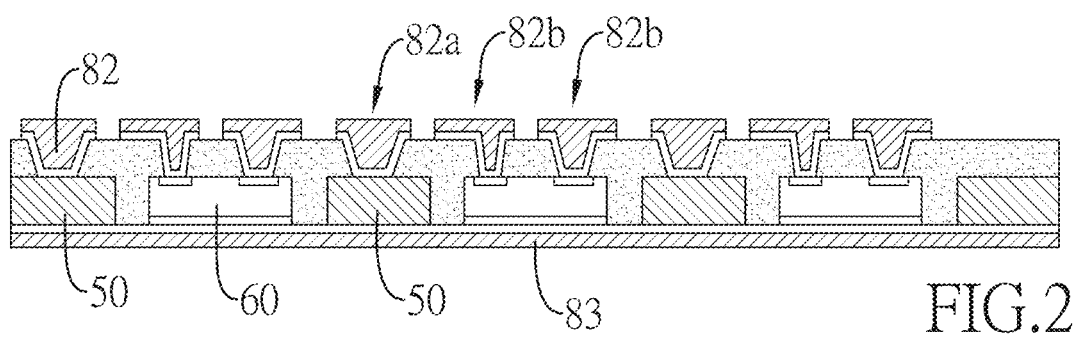

With reference to FIG. 2H, within the first/second vias 71a, 71b, and the surface of the plastic film layer 70, a conductive layer 82 is patterned and formed. Multiple independent conductive terminals are formed on the surface of the plastic film layer 70 as the conductive layer 82 on the surface of the plastic film layer 70 is patterned through etching or other patterning processes. Each location of the first/second vias 71a, 71b constitutes a pair of the independent conductive terminals 82a, 82b. Elsewise, according to designs of each of the chips 60, several of the first/second vias 71a, 71b can electrically connect to each other through the conductive layer 82, hence forming a common terminal. In the present embodiment, the conductive layer 82 is a copper layer, and the conductive layer 82 is made through electroplating or printing. Simultaneously, a connection layer 83 is formed on the bottoms of the plastic film layer 70, the chips 60, and the copper board 50. The third signal contact 60c on the back side of each of the chips 60 is electrically connected to the corresponding conductive terminals 82a through the connection layer 83 and the copper board 50. The connection layer 83 is made of copper and through methods such as electro-less plating and sputtering.

Once the conductive layer 82 and the connection layer 83 are formed, a surface process is further applied to a front and a back surface of the final product, forming a solder mask between the conductive terminals 82a, 82b. The surface process is shown in FIGS. 2I to 2K.

Figure 2I:
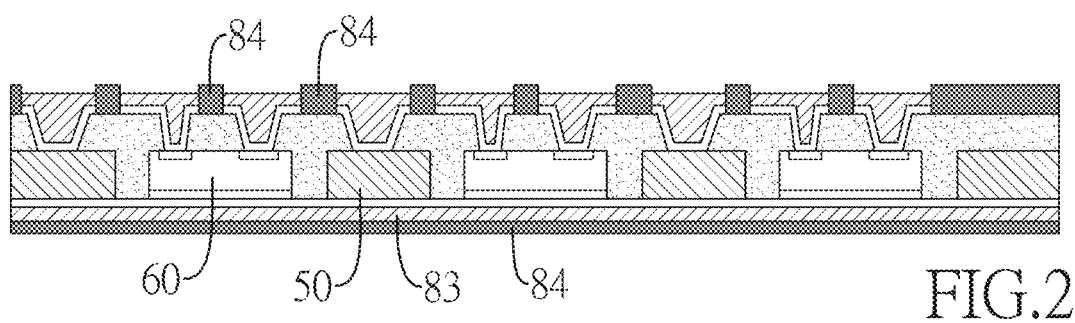

With reference to FIG. 2I, on a bottom of the connection layer 83 and between each of the adjacent conductive terminals 82a, 82b, an insulating protective layer 84 of insulating material is formed. The insulating protective layer 84 has functions of moist proof and anti-oxidation. Between each of the adjacent conductive terminals 82a, 82b, the insulating protective layer 84 functions as a solder mask, preventing short circuit between each of the adjacent conductive terminals 82a, 82b amidst soldering.

Figure 2J:
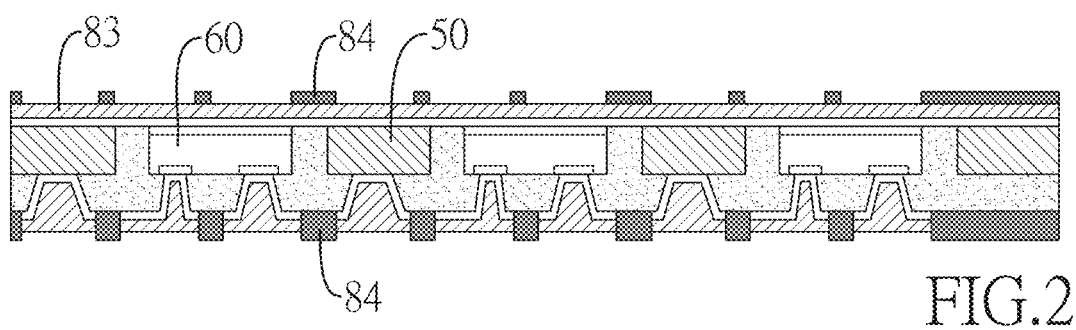

With reference to FIG. 2J, the insulating protective layer 84 on a back side of the connection layer 83 is processed by a marking process to leave a mark of product on the insulating protective layer 84. The marking process, for instance, can be a laser marking process or a lithographic process. The back side of the connection layer 83 faces away from the back side of the chips 60.

With reference to FIG. 2K, after the marking process, on a surface of each of the conductive terminals 82a, 82b, a terminal protection layer 85a, 85b is formed, so as to prevent oxidization of the each of the conductive terminals 82a, 82b. A protection layer 86 is further formed on the back side of the connection layer 83. Rather than just protecting surface of the connection layer 83, the protection layer 86 also provides a strong visual contrast against the patterned insulating protective layer 84. This way, the pattern of the insulating protective layer 84 is visually strongly contrasted. The terminal protection layer 85a, 85b and the protection layer 86 can be simultaneously formed with the same manufacturing process, a manufacturing process such as an electro-less nickel immersion gold (ENIG) method.

The aforementioned manufacturing process depicted in FIGS. 2I to 2K is free to adjust orders of manufacture steps within. For instance, after the insulating protective layer 84 is formed in FIG. 2I, the terminal protection layer 85a, 85b is first formed on the surface of each of the conductive terminals 82a, 82b, and then the marking process is applied to the insulating protective layer 44 on the back side of the connection layer 83. This way, the protection layer 86 is omitted from forming on the back side of the connection layer 83.

With reference to FIG. 2L, in the end a sawing process is applied to pre-determined locations for separating each of the chips 60. As such, each of the chips 60 with the plastic film layer 70 becomes an independent package product.

The copper board 50 of the second embodiment has sufficient structural support to enhance an overall structural strength of the package. In a final product, the copper board 50 also functions as a bridging conductor. The bridging conductor allows the third signal contact 60c on the back side of each of the chips 60 to be electrically connected to the front side. Since the bridging conductor is located below the first vias 71a, and since a depth of the first vias 71a is shallow, the conductive layer 82 can easily be added within the first vias 71a to ensure great electrical connections.

With reference to FIGS. 6A to 6I, a third embodiment of the present invention is detailed.

Figure 6A:
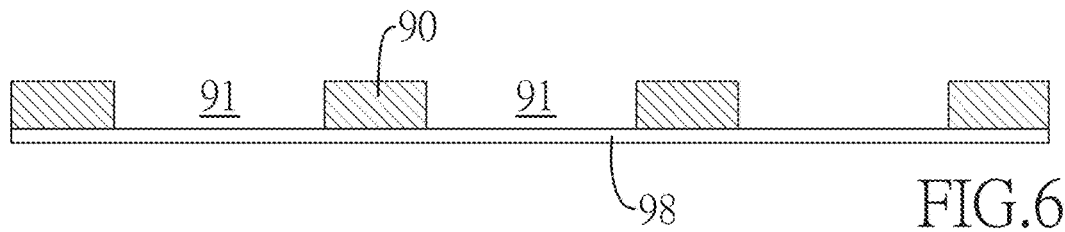

With reference to FIG. 6A, a copper board 90 is prepared. A conductive tape 98 is mounted on a bottom side of the copper board 90. A surface of the conductive tape 98 is adhesive. The copper board 90 has structure same as depicted in FIGS. 3 and 4, and therefore further descriptions are omitted.

Figure 6B:
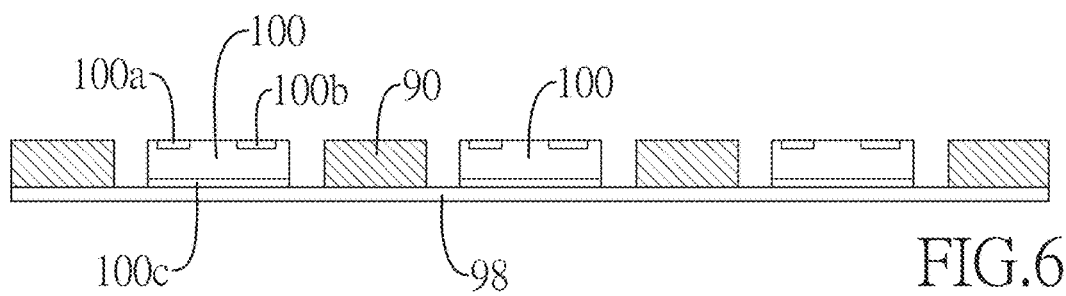

With reference to FIG. 6B, among multiple chips 100, each of the chips 100 is mounted within each of chip placed openings 91, and each of the chips 100 is a power semiconductor chip. A signal contact is formed on a front side and a back side of each of the chips 100, wherein each of the signal contact is an aluminum pad. More particularly, each of the chips 100 includes a first signal contact 100a and a second signal contact 100b on the front side, and a third signal contact 100c on the back side. The back side of each of the chips 100 refers to a side of each of the chips 100 facing the conductive tape 98, and the front side of each of the chips 100 refers to a side of each of the chips 100 facing away from the conductive tape 98. In other words, the third signal contact 100c for each of the chips 100 is mounted on the conductive tape 98.

Figure 6C:
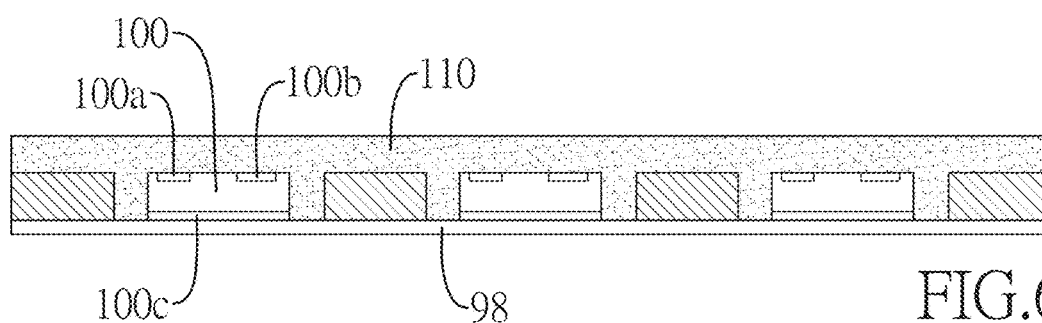

With reference to FIG. 6C, the chips 100 are covered with a plastic film layer 110. The plastic film layer 110 is made of dielectric materials such as PP or EMC. Once the plastic film layer 110 is formed, the plastic film layer 110 may be flattened. To flatten the plastic film layer 110, a surface of the plastic film layer 110 is subject to grinding or cleaning processes to make the surface flat and even.

Figure 6D:
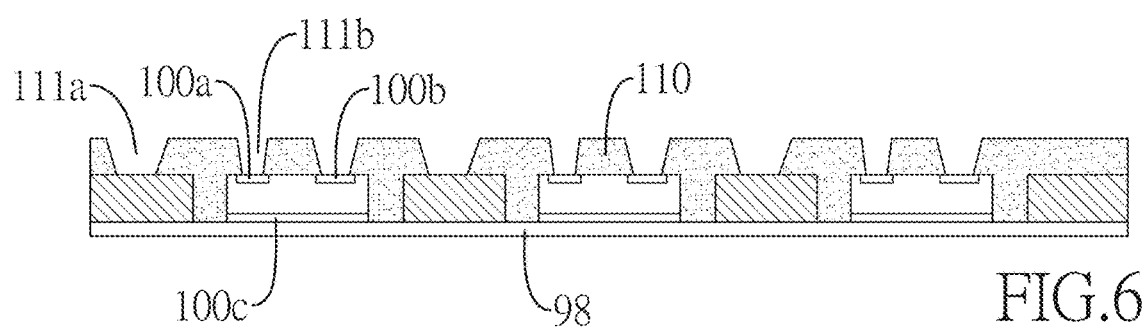

With reference to FIG. 6D, under a pre-designated area of the plastic film layer 110, multiple first vias 111a and multiple second vias 111b are formed. The pre-designated area where the first vias 111a and the second vias 111b are formed is determined by where conductive terminals of the final product should be located. The first vias 111a are adjacent to the chips 100, and the first vias 111a extend to the copper board 90. The second vias 111b extend from the surface of the plastic film layer 110 to the first signal contact 100a and the second signal contact 100b on the front side of the chips 100. The first/second vias 111a, 111b are formed with methods such as laser drilling, ultrasonic drilling, micro electrical discharge machining (μ-EDM), micro powder blasting, or inductively coupled plasma reactive ion etching (ICP-RIE). The first/second vias 111a, 111b are free to be formed with other methods in other embodiments of the present invention.

Figure 6E:
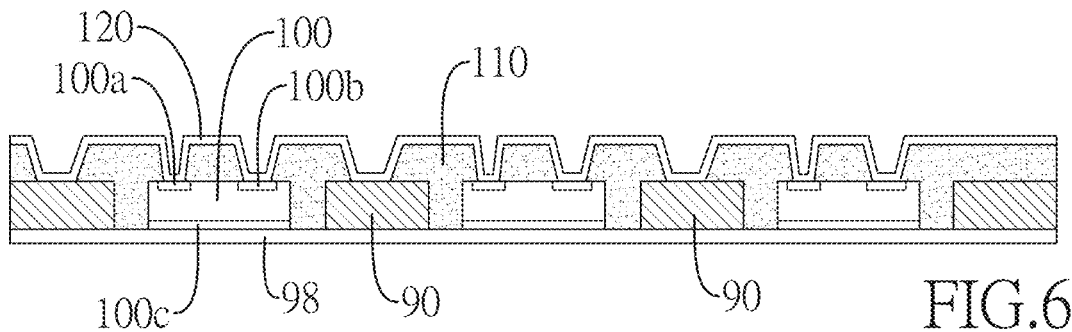

With reference to FIG. 6E, a pre-electroplated layer 120 is formed across inner surfaces of each of the first/second vias 111a, 111b, and the plastic film layer 110, and the surface of the first signal contact 100a and the second signal contact 100b of each of the chips 100. The pre-electroplated layer 120 serves as a seed layer for an electroplating process of later manufacturing stages. The pre-electroplated layer 120 is formed through methods such as electro-less plating or sputtering.

Figure 6F:
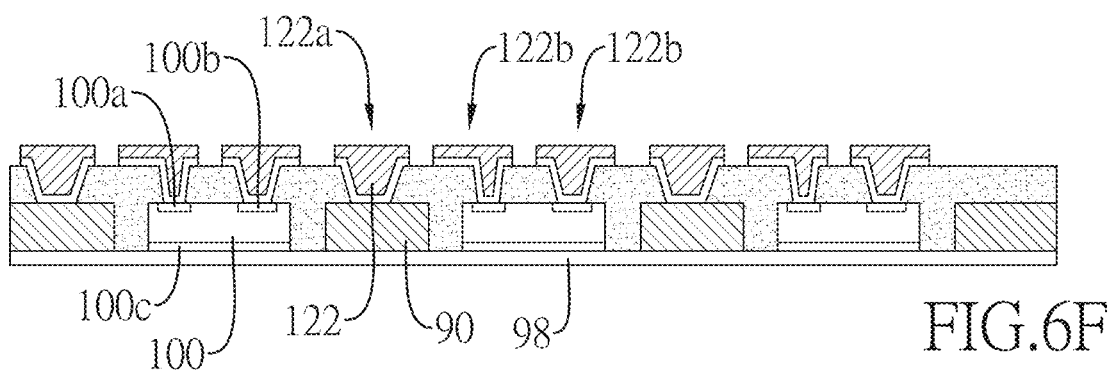

With reference to FIG. 6F, within the first/second vias 111a, 111b, and the surface of the plastic film layer 110, a conductive layer 122 is patterned and formed. Multiple independent conductive terminals are formed on the surface of the plastic film layer 110 as the conductive layer 122 on the surface of the plastic film layer 110 is patterned through etching or other patterning processes. Each location of the first/second vias 111a, 111b constitutes a pair of the independent conductive terminals 122a, 122b. Elsewise, according to designs of each of the chips 100, several of the first/second vias 111a, 111b can electrically connect to each other through the conductive layer 122, hence forming a common terminal. In the present embodiment, the conductive layer 122 is a copper layer, and the conductive layer 82 is made through electroplating or printing.

Once the conductive layer 122 is formed, a surface process is further applied to the front and the back sides of the final product, forming a solder mask between the conductive terminals 122a, 122b. The surface process is described in FIGS. 6G to 6I.

Figure 6G:
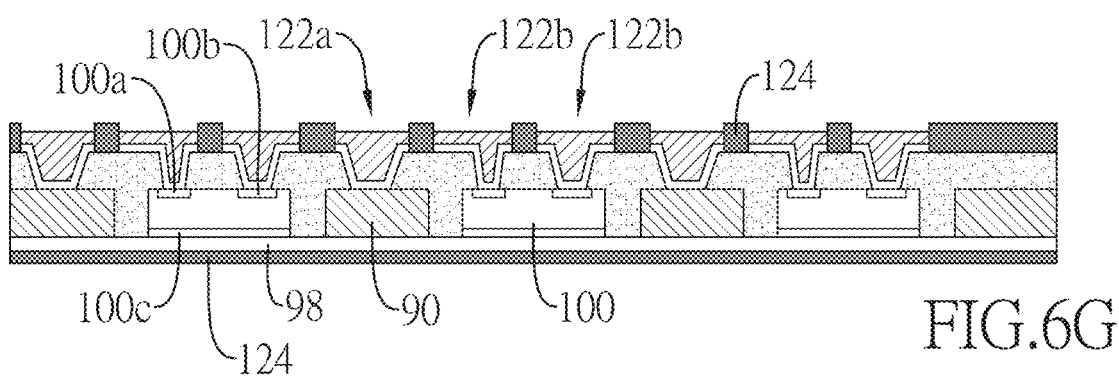

With reference to FIG. 6G, on a bottom of the conductive tape 98 and between each of the adjacent conductive terminals 122a, 122b, an insulating protective layer 124 of insulating material is formed. The insulating protective layer 124 has functions of moist proof and anti-oxidation. Between each of the adjacent conductive terminals 122a, 122b, the insulating protective layer 124 functions as a solder mask, preventing short circuit between each of the adjacent conductive terminals 122a, 122b amidst soldering.

Figure 6H:
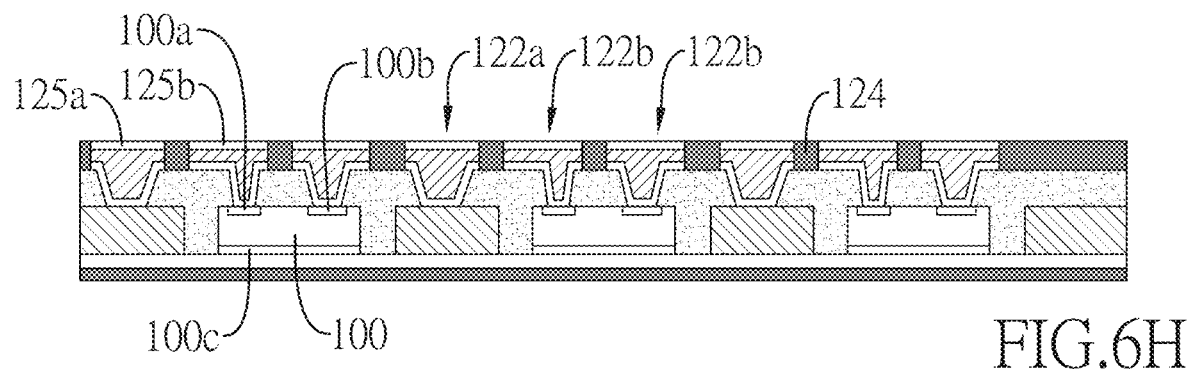

With reference to FIG. 6H, on a surface of each of the conductive terminals 122a, 122b, a terminal protection layer 125a, 125b is formed. The terminal protection layer 125a, 125b is formed from an electro-less nickel immersion gold (ENIG) method.

With reference to FIG. 6I, the insulating protective layer 124 on a back side of the conductive tape 98 is processed by a marking process to leave a mark of product on the insulating protective layer 124. The marking process, for instance, can be a laser marking process or a lithographic process. The back side of the conductive tape 98 faces away from the back sides of the chips 100.

The aforementioned manufacturing process depicted in FIGS. 6G to 6I is free to adjust orders of manufacture steps within. For instance, the aforementioned manufacturing process may adopt the same manufacturing process depicted in FIGS. 2I to 2K, wherein after marking, on the front side and the back side of a package, forming a protection layer by the electro-less nickel immersion gold (ENIG) method.

With reference to FIG. 6J, in the end a sawing process is applied to pre-determined locations for separating each of the chips 100. As such, each of the chips 100 with the plastic film layer 110 becomes an independent package product.

Figure 7:
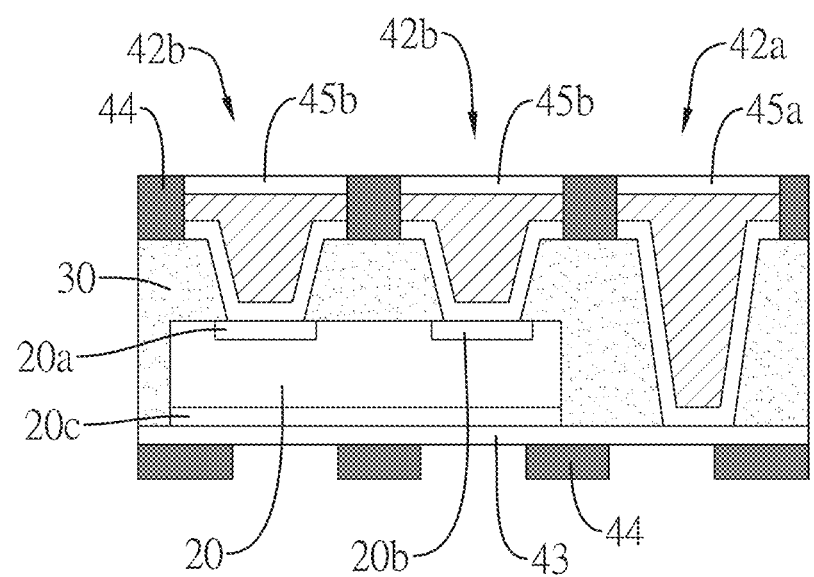
FIG. 7 is a cross-sectional perspective view of the first embodiment of the present invention.
Figure 8:
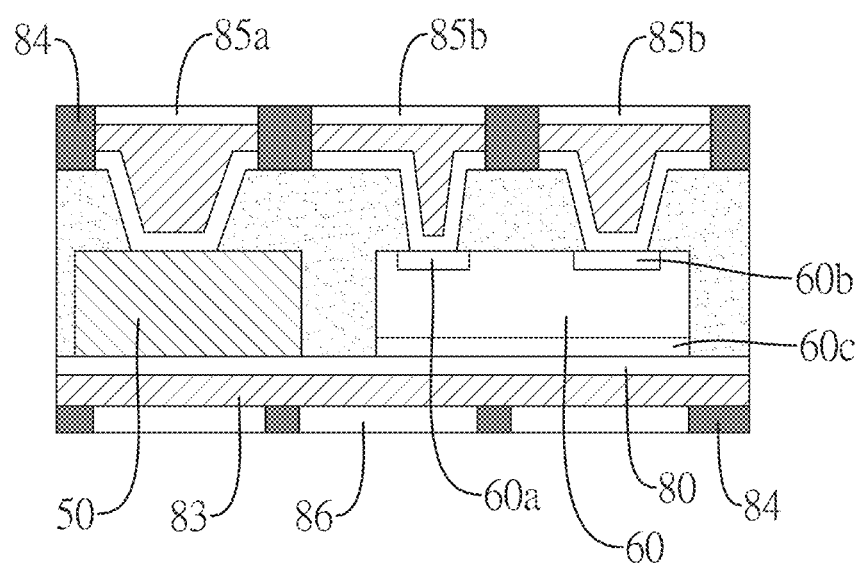
FIG. 8 is a cross-sectional perspective view of the second embodiment of the present invention.
Figure 9:
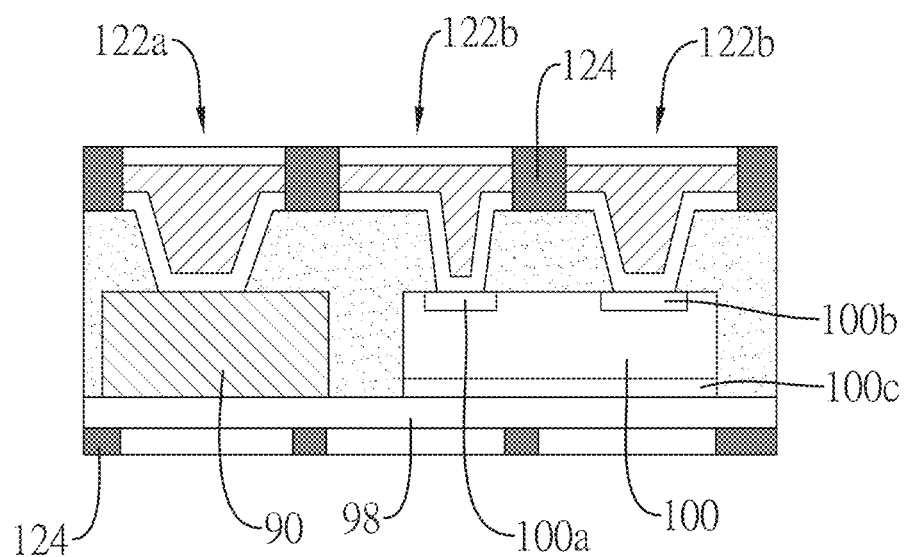
FIG. 9 is a cross-sectional perspective view of the third embodiment of the present invention.

With reference to FIGS. 7 to 9, based on the aforementioned three manufacturing embodiments of the present invention, a power semiconductor package unit of SMT can be accordingly manufactured.

More particularly, with reference to FIGS. 1A to 1M, the manufacturing process mentioned in the first embodiment results in the creation of the power semiconductor package unit of SMT as shown in FIG. 7.

In the first embodiment, the power semiconductor package unit of SMT includes a chip 20, a plastic film layer 30, and a conducting layer.

The chip 20 includes a front side and a back side. The front side and the back side are opposite to each other, and the front side and the back side each includes a signal contact. More particularly, each of the chips 20 includes a first signal contact 20a and a second signal contact 20b on the front side, and a third signal contact 20c on the back side.

The plastic film layer 30 covers the chip 20, and includes a first via 31a and a second via 31b. The first via 31a is formed adjacent to the chip 20, and the second via 31b is formed extending to the first signal contact 20a and the second signal contact 20b on the front side of the chip 20. In both the first via 31a and the second via 31b, a conductive layer 42 is formed. The conductive layer 42 in the second via 31b is electrically connected to the first signal contact 20a and the second signal contact 20b on the front side of the chip 20.

The conducting layer is formed on the back side of the chip 20, and the conducting layer is electrically connected to the conductive layer 42 in the first via 31a and the third signal contact 20c on the back side of the chip 20. The conducting layer is an electroplated layer 43.

The conductive layer 42 in the first via 31a and the conductive layer 42 in the second via 31b both protrude from a surface of the plastic film layer 30 and serve as conductive terminals 42a, 42b of the power semiconductor package unit of SMT.

With reference to FIGS. 2A to 2L, the manufacturing process mentioned in the second embodiment results in the creation of the power semiconductor package unit of SMT as shown in FIG. 8.

In the second embodiment, the power semiconductor package unit of SMT includes a chip 60, a conductive board, a plastic film layer 70, and a conducting layer.

The chip 60 includes a front side and a back side. The front side and the back side are opposite to each other, and the front side and the back side each includes a signal contact. More particularly, each of the chips 60 includes a first signal contact 60a and a second signal contact 60b on the front side, and a third signal contact 60c on the back side.

The conductive board includes a chip placed opening 51, and the chip 60 is mounted inside the chip placed opening 51. The conductive board is a copper board 50.

The plastic film layer 70 covers the chip 60 and the conductive board. The plastic film layer 70 includes a first via 71a and a second via 71b. The first via 71a is formed adjacent to the chip 60, and the first via 71a extends to a surface of the conductive board. The second via 71b is formed extending to the first signal contact 60a and the second signal contact 60b on the front side of the chip 60. In both the first via 71a and the second via 71b, a conductive layer 82 is formed. The conductive layer 82 in the first via 71a is electrically connected to the conductive board, and the conductive layer 82 in the second via 71b is electrically connected to the first signal contact 60a and the second signal contact 60b on of the front side of the chip 60.

The conducting layer is formed on the back side of the chip 60. The conducting layer is electrically connected to the conductive board and the third signal contact 60c on the back side of the chip 60.

Through the conductive board and the conducting layer, the conductive layer 82 in the first via 71a is electrically connected to the third signal contact 60c on the back side of the chip 60. The conductive layer 82 is a multi-layered structure, and the conductive layer 82 includes a pre-electroplated layer 80 and a connection layer 83.

The conductive layer 82 in the first via 71a and the conductive layer 82 in the second via 71b both protrude from a surface of the plastic film layer 70 and serve as conductive terminals 82a, 82b of the power semiconductor package unit of SMT.

With reference to FIGS. 6A to 6J, the manufacturing process mentioned in the third embodiment results in the creation of the power semiconductor package unit of SMT as shown in FIG. 9.

In the third embodiment, the power semiconductor package unit of SMT includes a chip 100, a conductive board, a plastic film layer 110, and a conducting layer.

The chip 100 includes a front side and a back side. The front side and the back side are opposite to each other, and the front side and the back side each includes a signal contact. More particularly, each of the chips 100 includes a first signal contact 100a and a second signal contact 100b on the front side, and a third signal contact 100c on the back side.

The conductive board includes a chip placed opening 91, and the chip 100 is mounted inside the chip placed opening 91. The conductive board is a copper board 90.

The plastic film layer 110 covers the chip 100 and the conductive board. The plastic film layer 110 includes a first via 111a and a second via 111b. The first via 111a is formed adjacent to the chip 60, and the first via 111a extends to a surface of the conductive board. The second via 111b is formed extending to the first signal contact 100a and the second signal contact 100b on the front side of the chip 100. In both the first via 111a and the second via 111b, a conductive layer 122 is formed. The conductive layer 122 in the first via 111a is electrically connected to the conductive board, and the conductive layer 122 in the second via 111b is electrically connected to the first signal contact 100a and the second signal contact 100b on the front side of the chip 100.

The conducting layer is formed on the back side of the chip 100. The conducting layer is electrically connected to the conductive board and the third signal contact 100c on the back side of the chip 100.

Through the conductive board and the conducting layer, the conductive layer 122 in the first via 111a is electrically connected to the third signal contact 100c on the back side of the chip 100. The conductive layer 122 includes a conductive tape 98 mounted on the back side of the chip 100.

The conductive layer 122 in the first via 111a and the conductive layer 122 in the second via 111b both protrude from a surface of the plastic film layer 110 and serve as conductive terminals 122a, 122b of the power semiconductor package unit of SMT.

Concluding from the aforementioned three embodiments of the present invention, the power semiconductor package unit of SMT of the present invention includes the following benefits:

1. The manufacturing method excludes the use of traditional lead frames and wire bonding. Furthermore, the manufacturing method excludes the use of expensive materials such as silver paste or silver (Ag) sintering for die bonding. As such, the manufacturing method is able to achieve die bonding with decreased manufacturing cost.

2. The thickness of the package can be reduced.

3. The conductive layer in the first/second via as well as the bridging conductor made from the copper board provides great heat dissipating pathways for heat dissipation.

4. The bridging conductors mounted adjacent to the chip are able to surround the power semiconductor chip, hence providing shielding effects for electromagnetic interference (EMI) for the chip.

What is claimed is:

1. A power semiconductor package unit of surface mount technology, comprising:
   a chip comprising a front side and a back side, wherein the front side and the back side are opposite to each other, and the front side and the back side each have a signal contact, wherein the chip is a power semiconductor chip;
   a plastic film layer covering the chip, the plastic film layer comprising a first via and a second via, each of the first via and the second via having inner surfaces, wherein the first via is formed adjacent to the chip, and the second via is formed extending to the signal contact of the front side of the chip, wherein a conductive layer is formed in each of the first via and the second via, and the conductive layer in the second via is electrically connected to the signal contact of the front side of the chip; and
   a conducting layer formed on the back side of the chip, the conducting layer electrically connecting the conductive layer in the first via and the signal contact of the back side of the chip, wherein the conducting layer is an electroplated layer;
   wherein the conductive layer in the first via and the conductive layer in the second via both protrude from a surface of the plastic film layer and are conductive terminals of the power semiconductor package unit of surface mount technology;
   wherein a surface of each of the conductive terminals has a terminal protection layer; a solder mask is formed between the conductive terminals, and the solder mask is attached on the surface of the plastic film layer; and a back side of the conducting layer forms an insulating protective layer.

2. The power semiconductor package unit of surface mount technology as claimed in claim 1, wherein the first via is formed through the plastic film layer; and the inner surfaces of the first via and the second via each comprise a pre-electroplated layer.

3. The power semiconductor package unit of surface mount technology as claimed in claim 1, wherein the conductive layer is a copper layer.

4. A power semiconductor package unit of surface mount technology comprising:
   a chip comprising a front side and a back side; wherein the front side and the back side are opposite to each other, and the front side and the back side each comprises a signal contact;
   a conductive board comprising a chip placed opening, wherein the chip is mounted inside the chip placed opening;
   a plastic film layer covering the chip and the conductive board, the plastic film layer comprising a first via and a second via, wherein the first via is formed adjacent to the chip, the first via extends to a surface of the conductive board, the second via is formed extending to the signal contact of the front side of the chip, wherein a conductive layer is formed in each of the first via and the second via, the conductive layer in the first via is electrically connected to the conductive board, and the conductive layer in the second via is electrically connected to the signal contact of the front side of the chip; and
   a conducting layer formed on the back side of the chip, the conducting layer electrically connecting the conductive board and the signal contact of the back side of the chip;
   wherein the conductive layer in the first via and the conductive layer in the second via both protrude from a surface of the plastic film layer and serve as conductive terminals of the power semiconductor package unit of surface mount technology.

5. The power semiconductor package unit of surface mount technology as claimed in claim 4, wherein the conductive layer is a multi-layered structure and comprises a pre-electroplated layer and a connection layer; and the connection layer is made of copper.

6. The power semiconductor package unit of surface mount technology as claimed in claim 4, wherein the conductive layer is a conductive tape.

7. The power semiconductor package unit of surface mount technology as claimed in claim 5, wherein the inner surfaces of the first via and the second via each comprise a pre-electroplated layer.

8. The power semiconductor package unit of surface mount technology as claimed in claim 6, wherein the inner surfaces of the first via and the second via each comprise a pre-electroplated layer.

9. The power semiconductor package unit of surface mount technology as claimed in claim 5, wherein a surface of each of the conductive terminals mounts a terminal protection layer; a solder mask is formed between the conductive terminals, and the solder mask is attached on a surface of the plastic film layer, and a back side of the conducting layer forms an insulating protective layer.

10. The power semiconductor package unit of surface mount technology as claimed in claim 6, wherein a surface of each of the conductive terminals has a terminal protection layer; a solder mask is formed between the conductive terminals, and the solder mask is attached on the surface of the plastic film layer, and a back side of the conducting layer forms an insulating protective layer.

11. The power semiconductor package unit of surface mount technology as claimed in claim 5, wherein the conductive layer is a copper layer, and the conductive board is a copper board.

12. The power semiconductor package unit of surface mount technology as claimed in claim 6, wherein the conductive layer is a copper layer and the conductive board is a copper board.

13. The power semiconductor package unit of surface mount technology as claimed in claim 5, wherein the chip placed openings have at least one corner, and each corner comprises a corner anti-collision space that extends outwards away from each of the corners of the chip placed opening and communicates with the chip placed opening; wherein the corner anti-collision space uses a tip of the corner of the chip placed opening as a center of a circle; the circle extends outwards away from each of the corners of the chip placed opening to form a circular bumper space.

14. The power semiconductor package unit of surface mount technology as claimed in claim 6, wherein the chip placed openings have at least one corner, and each corner comprises a corner anti-collision space that extends outwards away from each of the corners of the chip placed opening and communicates with the chip placed opening; wherein the corner anti-collision space uses a tip of the corner of the chip placed opening as a center of a circle; the circle extends outwards away from each of the corners of the chip placed opening to form a circular bumper space.

* * * * *